(12) United States Patent
Durec et al.

(10) Patent No.: US 9,064,083 B2
(45) Date of Patent: Jun. 23, 2015

(54) P AND N REGION DIFFERENTIATION FOR IMAGE-TO-CAD ALIGNMENT

(71) Applicant: DCG Systems, Inc., Fremont, CA (US)

(72) Inventors: Jan Durec, San Jose, CA (US); Catherine Kardach, Saratoga, CA (US)

(73) Assignee: DCG SYSTEMS, INC., Fremont, CA (US)

( * ) Notice: Subject to any disclaimer, the term of this patent is extended or adjusted under 35 U.S.C. 154(b) by 0 days.

(21) Appl. No.: 13/961,761

(22) Filed: Aug. 7, 2013

(65) Prior Publication Data

US 2014/0047396 A1   Feb. 13, 2014

Related U.S. Application Data

(60) Provisional application No. 61/681,119, filed on Aug. 8, 2012.

(51) Int. Cl.
*G06F 17/50*   (2006.01)
*G03F 1/36*   (2012.01)

(52) U.S. Cl.
CPC .............. *G06F 17/5081* (2013.01); *G03F 1/36* (2013.01)

(58) Field of Classification Search
CPC ........................................................ G06F 17/50
USPC ............................................................ 716/52
See application file for complete search history.

(56) References Cited

U.S. PATENT DOCUMENTS

| 8,750,595 B2 * | 6/2014 | Stellari | .................. 382/149 |
| 2012/0087568 A1 | 4/2012 | Stellari | |

FOREIGN PATENT DOCUMENTS

TW   2011-31287   9/2011

OTHER PUBLICATIONS

Search Report issued in TW Patent Application No. 102128516 dated Feb. 17, 2015, 8 pages, with English translation, 6 pages.

* cited by examiner

*Primary Examiner* — Thuan Do
(74) *Attorney, Agent, or Firm* — Nixon Peabody LLP; Joseph Bach, Esq.

(57) ABSTRACT

In one embodiment, a method for aligning an image of a semiconductor device with a bitmap representation thereof includes receiving diffusion layer information of at least a portion of the semiconductor device, receiving implant layer information of the at least a portion of the semiconductor device, deriving distinct p- and n-doped region information from the received diffusion and implant layer information, generating the bitmap representation, including a differentiation between the distinct p- and n-doped regions, and performing an alignment operation of the image of the semiconductor device with generated bitmap representation.

22 Claims, 13 Drawing Sheets

Found It!!

Can't find it!!

Found It!!

P AND N REGION DIFFERENTIATION FOR IMAGE-TO-CAD ALIGNMENT

PRIORITY CLAIM

The present application claims the benefit of priority based on U.S. Provisional Patent Application Ser. No. 61/681,119, titled "SOFTWARE METHOD FOR ALIGNING A SILICON IMAGE TO THE CAD SUB-REGION WITH SINGLE-NANOMETER ACCURACY USING A CROSS-CORRELATION AND BEST FIT ALGORITHM", filed on Aug. 8, 2012.

TECHNICAL FIELD

The disclosure relates to identifying CAD (computer aided design) mask layers that are observable in a silicon image and using these layers to perform a cross-correlation between the image and a corresponding CAD sub-region.

BACKGROUND

During design of new microchips, prototypes are made and tested using various testing methods, such as photoemission, time-resolved photon emission (TRPE), laser-assisted device alteration (LADA), light-induced voltage alteration (LIVA), optical beam induced current (OBIC), and so on. Such analysis requires precisely locating the various devices within the microchip. This can be done by correlating the image of the actual device to the CAD data of that device. Accurate image-to-CAD coordinate registration is critical to image-based failure analysis and other applications. The human eye cannot easily match patterns between a silicon image and CAD (computer-aided design) data in the advanced technology nodes (40 nm and below). While coarse image-to-CAD alignment is achieved with a global alignment of the CAD to the microscope stage, fine-alignment requires nanometer accuracy and is increasingly difficult to accomplish manually with smaller, denser technology nodes.

CAD navigation refers to software tools which are used for the correlation of electronic semiconductor design data with a physical semiconductor device. CAD navigation tools consist of software that is capable of reading and displaying the physical layout and logical schematic for the device. The logical design consists of a netlist and/or a schematic which describes the electrical circuitry of the microchip. The physical design consists of a set of polygons which precisely represent the location of all electrical conductors, diffusions and interconnections in the physical semiconductor device. CAD navigation tools are often used to provide a cross-correlation between the logical design and the physical design. CAD navigation tools are used extensively with various probers for the purpose of semiconductor failure analysis.

Choosing the CAD mask layer(s) that match the backside silicon image requires more steps with advanced technology nodes. While the diffusion layer is a good match on 40 nm CMOS processes, p-doped and n-doped diffusions are observed to have different contrast (grayscale) on a 28 nm CMOS process. It would be useful to exploit the different contrast, by differentiating between p-doped and n-doped diffusions, to improve alignment techniques before running cross-correlation of the CAD data to the image data.

Many mask design databases do not define (draw) p-doped and n-doped diffusions on separate layers. Additional layers, called implant layers (for example n- or p-implant) differentiate the diffusion polygons. CAD tools that drive a microscope used in alignment read the raw mask database, and hence do not derive p- and n-diffusion layer polygons.

Figure 1:
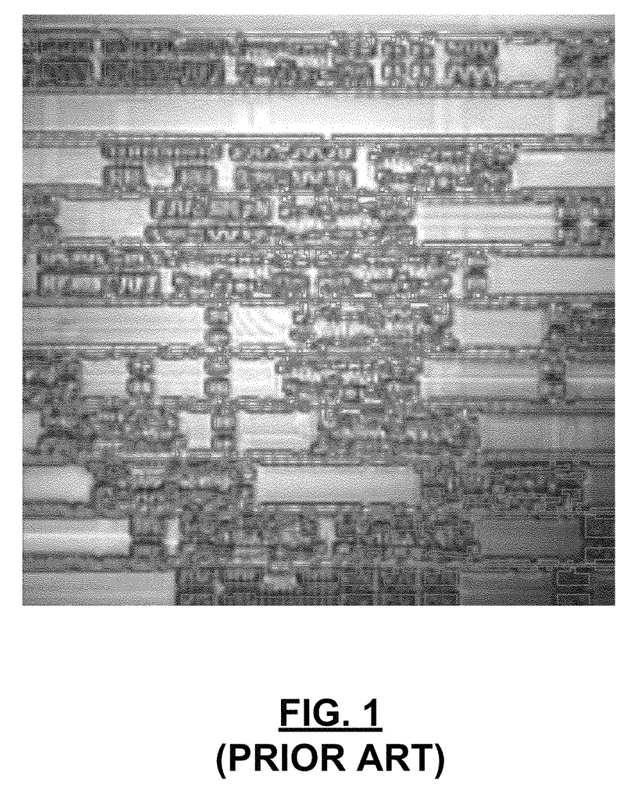
FIG. 1 shows a conventional overlay of a CAD diffusion layer, shown in outline, on a backside silicon image.

FIG. 1 shows a conventional overlay of a CAD diffusion layer, shown in outline, on a backside silicon image (in this case, an LSM image). P-doped and n-doped diffusions are roughly the same grayscale. Notably, the P and N diffusion regions are drawn on the same layer and lack differentiation.

OVERVIEW

As described herein, a method for aligning an image of a semiconductor device with a bitmap representation thereof includes receiving diffusion layer information of at least a portion of the semiconductor device, receiving implant layer information of the at least a portion of the semiconductor device, deriving distinct p- and n-doped region information from the received diffusion and implant layer information, generating the bitmap representation, including a differentiation between the distinct p- and n-doped regions, and performing an alignment operation of the image of the semiconductor device with generated bitmap representation.

Also as described herein, an alignment system includes an image capture module operable to capture of an image of a patterned semiconductor device, a CAD (computer-aided design) tool operable to provide diffusion layer information and implant layer information, an alignment tool. The alignment tool is operable to receive the diffusion layer information, implant layer information, and image information representative of the captured image, overlay the diffusion layer information and implant layer information to derive therefrom a bitmap representation that includes a differentiation between the distinct p- and n-doped regions, and align the bitmap representation to the image information.

Also as described herein, a non-transitory computer readable storage medium storing one or more programs configured to be executed by one or more computing devices, said programs, when executing on the one or more computing devices, performing a method for aligning an image of a semiconductor device with a bitmap representation thereof. The method includes receiving diffusion layer information of at least a portion of the semiconductor device, receiving implant layer information of said at least a portion of the semiconductor device, deriving distinct p- and n-doped region information from the received diffusion and implant layer information, generating the bitmap representation, including a differentiation between the distinct p- and n-doped regions, and performing an alignment operation of the image of the semiconductor device with generated bitmap representation.

Also as described herein, an alignment tool operable to receive an image of a patterned semiconductor device, diffusion layer information, and implant layer information, overlay the diffusion layer information and implant layer information to derive therefrom a bitmap representation that includes a differentiation between distinct p- and n-doped regions, and align the bitmap representation to the image information.

Also as described herein, a method for performing alignment of CAD bitmap to device image, includes obtaining a device image, importing representative CAD layer polygons for a region matching an image field of view, assigning calibrated shades of grayscale to polygons in the CAD bitmap, running cross-correlation of the device image within the CAD bitmap, locating a maximum in the cross-correlation, to thereby represent offset between the device image and CAD bitmap, and using the CAD bitmap with the assigned calibrated shades of grayscale to polygons as the basis for auto-CAD-to-image correlation

BRIEF DESCRIPTION OF THE DRAWINGS

The accompanying drawings, which are incorporated into and constitute a part of this specification, illustrate one or more examples of embodiments and, together with the description of example embodiments, serve to explain the principles and implementations of the embodiments.

In the drawings.

DESCRIPTION OF EXAMPLE EMBODIMENTS

Example embodiments are described herein in the context of a P and N region differentiation system and method for image-to-CAD alignment. Those of ordinary skill in the art will realize that the following description is illustrative only and is not intended to be in any way limiting. Other embodiments will readily suggest themselves to such skilled persons having the benefit of this disclosure. Reference will now be made in detail to implementations of the example embodiments as illustrated in the accompanying drawings. The same reference indicators will be used to the extent possible throughout the drawings and the following description to refer to the same or like items.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with this disclosure, the components, process steps, and/or data structures described herein may be implemented using various types of operating systems, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible, non-transitory medium such as a computer memory device (e.g., ROM (Read Only Memory), PROM (Programmable Read Only Memory), EEPROM (Electrically Eraseable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card, paper tape and the like) and other types of program memory.

The term "exemplary" when used herein is intended to mean "serving as an example, instance or illustration." Any embodiment described herein as "exemplary" is not necessarily to be construed as preferred or advantageous over other embodiments.

Figure 2:
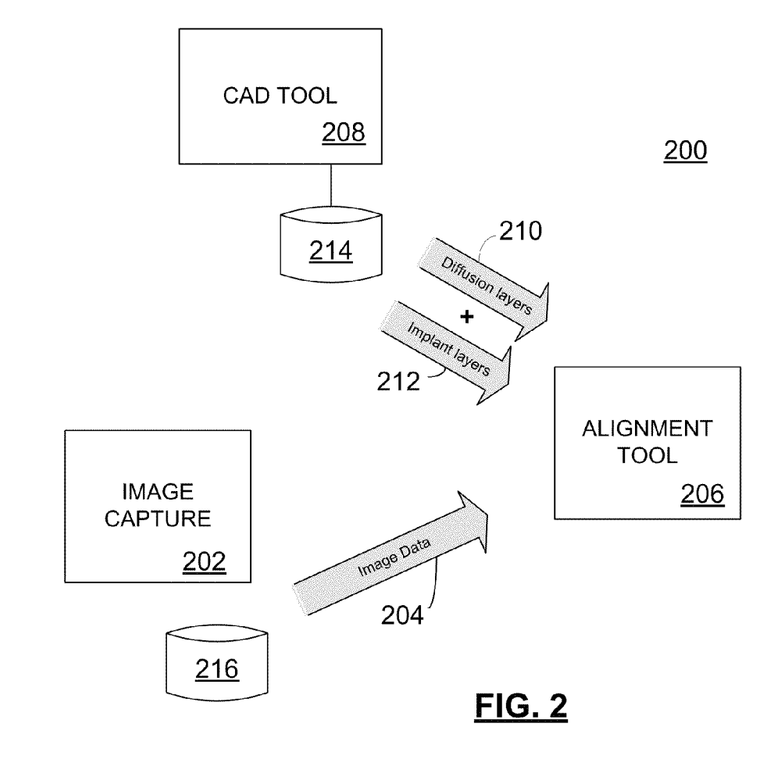
FIG. 2 is a schematic diagram of an alignment system for aligning an image of a patterned semiconductor device, such as a patterned silicon wafer or portions thereof, with a CAD (computer-aided design)-generated representation thereof
Figure 2A:
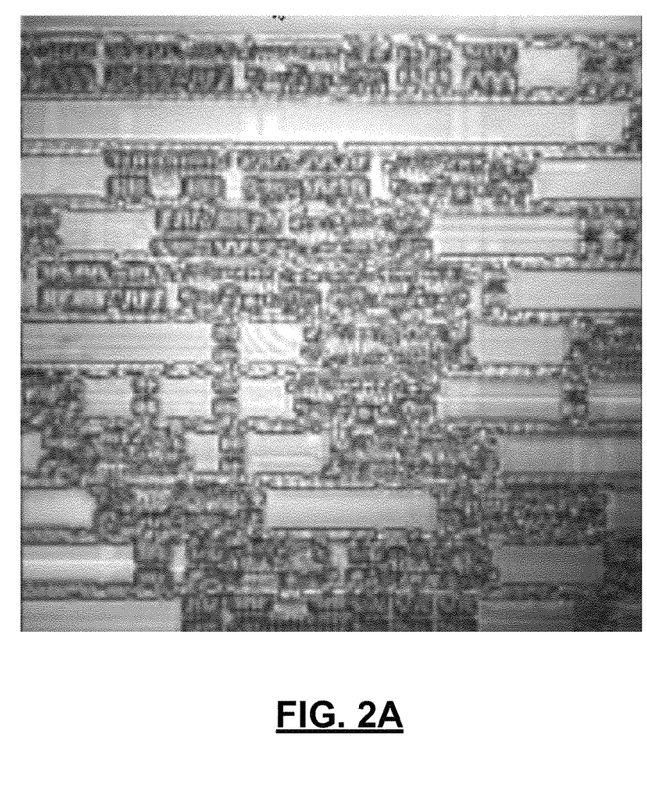
FIG. 2A is a rendering of image data depicting undifferentiated N- and P-type diffusions in grayscale.

FIG. 2 is a schematic diagram of an alignment system 200 for aligning an image of a patterned semiconductor device, such as a patterned silicon wafer or portions thereof, with a CAD (computer-aided design)-generated representation thereof. In system 200, image capture is performed by a capture module 202, such as a specially-equipped camera. Backside image data 204 from image capture module 202 is delivered to an alignment tool 206. A rendering of the image data is shown in FIG. 2A, depicting the undifferentiated N- and P-type diffusions in grayscale.

Figure 2B:
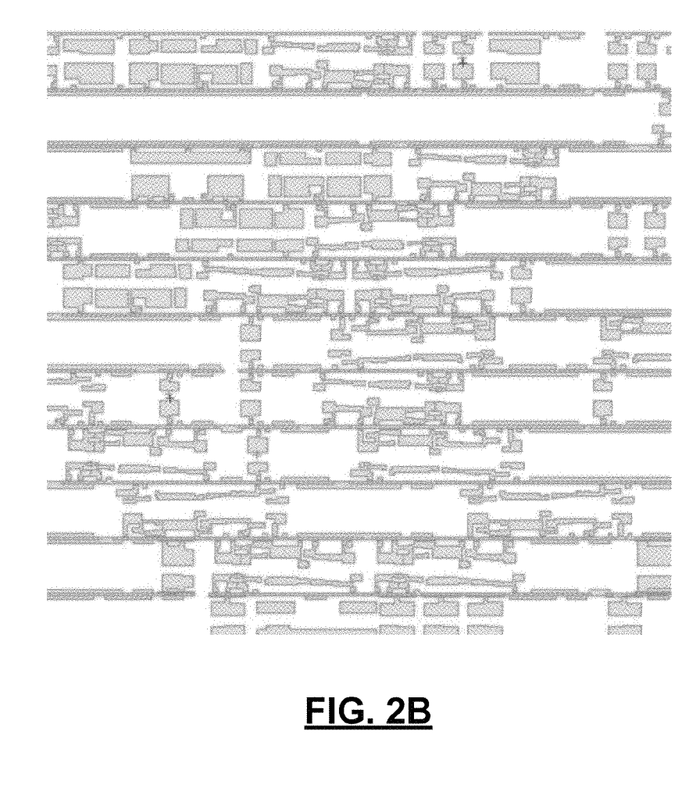
FIG. 2B is a rendering of received data including conventional diffusion layer information 210.
Figure 2C:
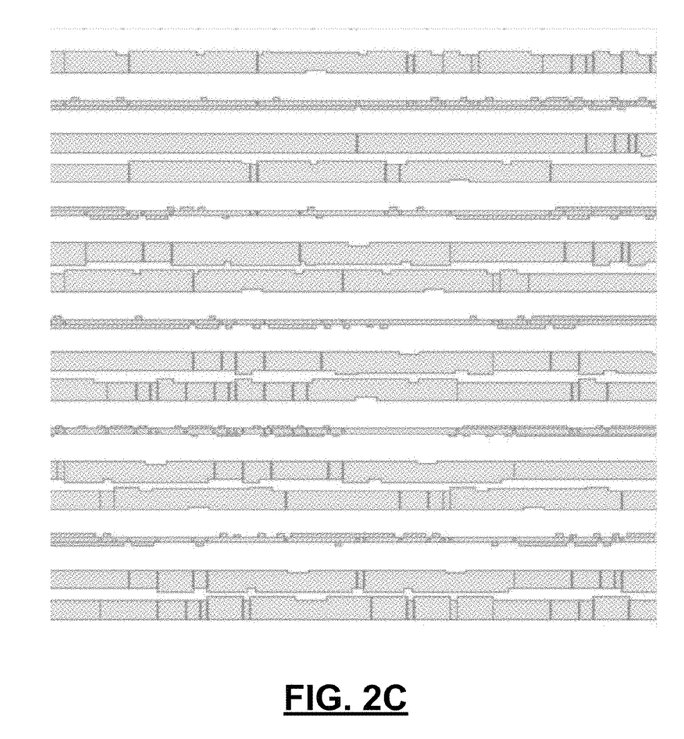
FIG. 2C is rendering of received data that includes implant layer information 212.

Alignment tool 206 also receives data from CAD tool 208. The received data from CAD tool 208 includes conventional diffusion layer information 210, a rendering of which is shown in FIG. 2B. The received data from CAD tool 208 also includes implant layer information 212, a rendering of which is shown in FIG. 2C. One example of a CAD tool may include a mask design tool.

Data storage devices 214 and 216 may be used to store the various data prior to delivery. Delivery of the data to the alignment tool may be wired or wireless, over local or wide area networks, or over the Internet.

Using the received diffusion layer information 210 and the implant layer information 212, alignment tool 206 performs one of several possible procedures for obtaining a more detailed indication of the features of the portion of the backside silicon image of interest. Specifically, the more detailed indication is in the form of a bitmap representation that enables a differentiation between p- and n-doped regions, such that more accurate alignment with the backside silicon image can be achieved.

In accordance with certain embodiments, in the simplest case, deriving n-doped and p-doped region information to facilitate more accurate alignment is accomplished by the Boolean operations:

TABLE A

| DRAWN MASK LAYERS AND BOOLEAN OPERATION | DERIVED LAYER |
|---|---|
| diffusion AND N-implant | N-diffusion |
| diffusion AND P-implant | P-diffusion |

In accordance with one embodiment, wherein if the mask databases use only one implant layer to define both diffusion types, deriving n-doped and p-doped region information to facilitate more accurate alignment is accomplished by the Boolean operations:

TABLE B

| DRAWN MASK LAYERS AND BOOLEAN OPERATION | DERIVED LAYER |
|---|---|
| diffusion AND N-implant | N-diffusion |
| diffusion AND NOT N-implant | P-diffusion |

Alternatively, in some situations:

TABLE C

| DRAWN MASK LAYERS AND BOOLEAN OPERATION | DERIVED LAYER |
|---|---|
| diffusion AND P-implant | P-diffusion |
| diffusion AND NOT P-implant | N-diffusion |

Figure 3:
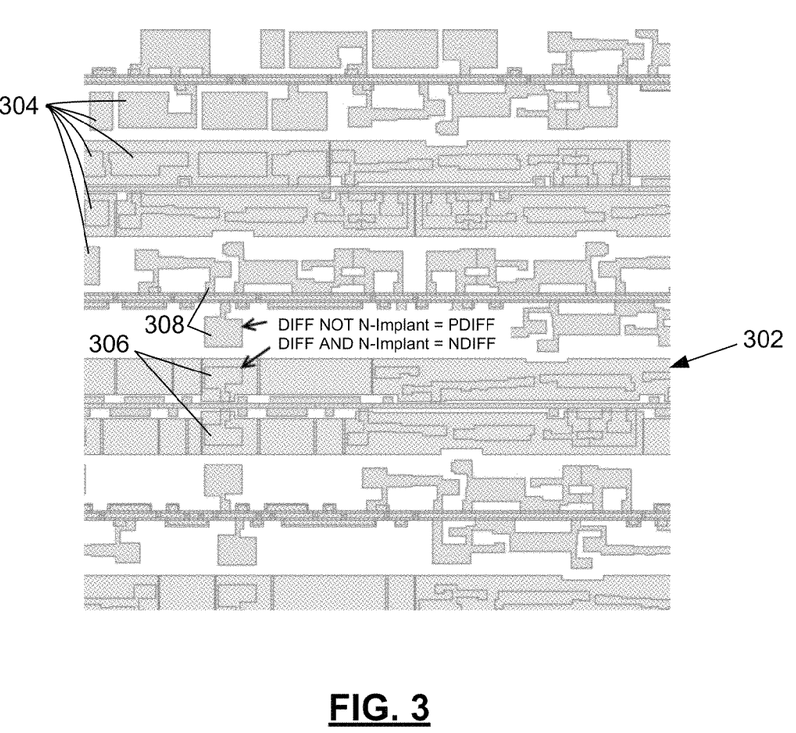
FIG. 3 shows a rendering in which P- and N-diffusion polygons are obtained.

FIG. 3 shows a rendering in which P- and N-diffusion polygons are obtained using the derivations in Table B above. Specifically, in FIG. 3, region 302 delineates an N implant region, superposed or overlaid on the various diffusion regions 304. From this superposition, N-diffusion regions 306 can be deduced (diffusion AND N-implant), along with P-diffusion regions 308 (diffusion AND NOT N-implant).

Figure 4:
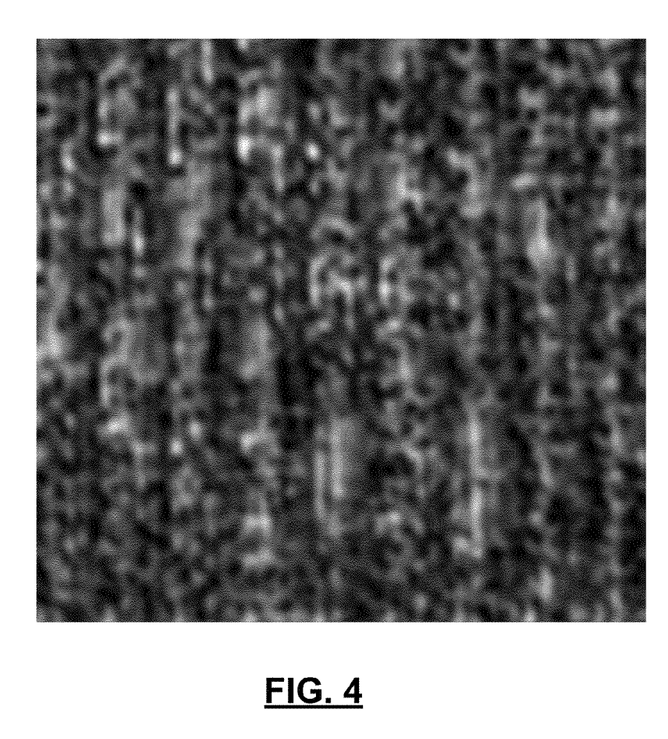
FIG. 4 a backside LSM image with different contrast for p and n diffusion regions.

In certain embodiments, an assignment of gray scales for the n and p diffusion regions may be made. This may be accomplished automatically, or by prompting a user to identify a sample of each in the backside silicon image. Such assignment in illustrated in FIG. 4, showing a backside LSM image with different contrast for p and n diffusion regions.

Figure 5:
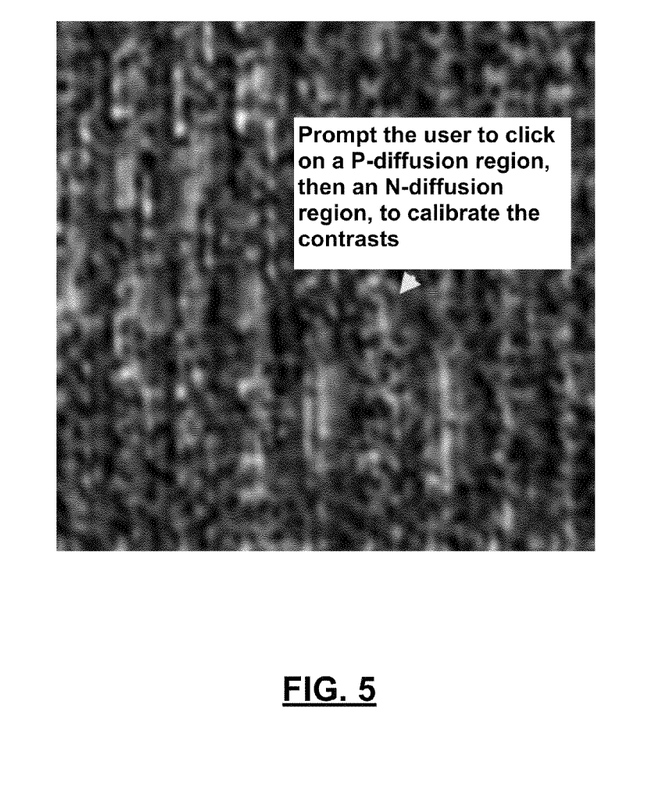
FIG. 5 shows an interactive calibration of P- and N-greyscale levels or a simple grayscale color palette from which the user can select a best match of grayscale in the image.
Figure 6:
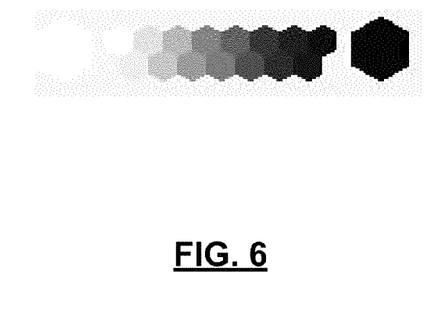
FIG. 6 shows a greyscale color selection palette from Microsoft PowerPoint™ for example.

In certain embodiments, a user interface on the microscope side is used to facilitate the assignment of grayscale to p- or n-diffusion. The user interface can utilize a "color picker" similar to a picture editing tool such as paint.net. FIG. 5 shows an interactive calibration of P- and N-greyscale levels or a simple grayscale color palette from which the user selects a best match of grayscale in the image. FIG. 6 shows a greyscale color selection palette from Microsoft PowerPoint™ for example. In certain embodiments, a user interface on the microscope side to assign mask database layer name (e.g. DIFF, NIMP, PIMP) to diffusion layers and implant layers for the software routine that will derive p- and n-diffusion polygons.

Figure 7A:
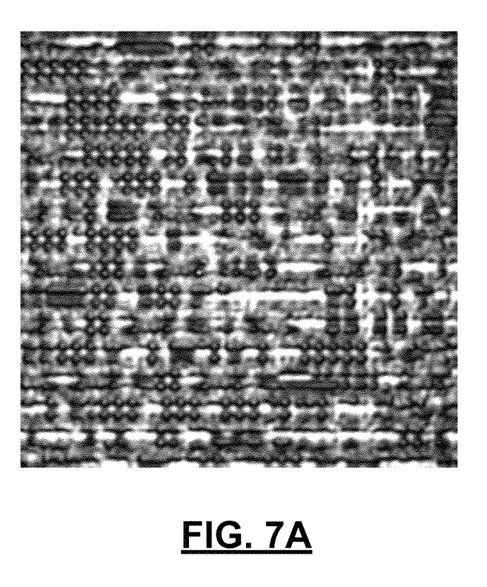
FIGS. 7A-7E relate to a method for aligning a CAD bitmap representation with a device image in accordance with certain embodiments.
Figure 7B:
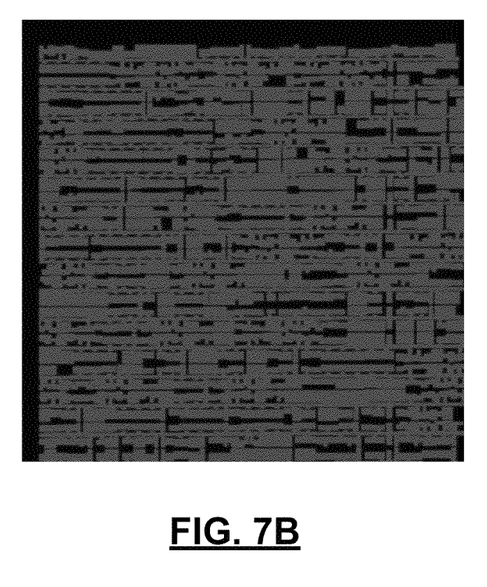
Figure 7C:
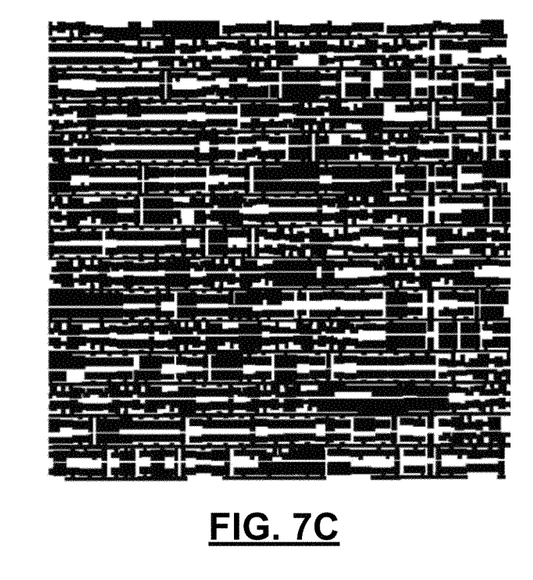
Figure 7D:
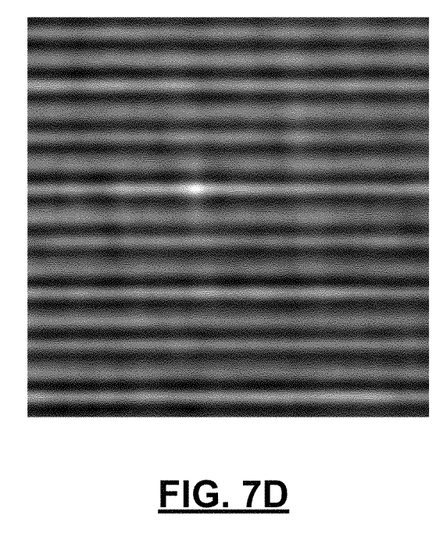
Figure 7E:
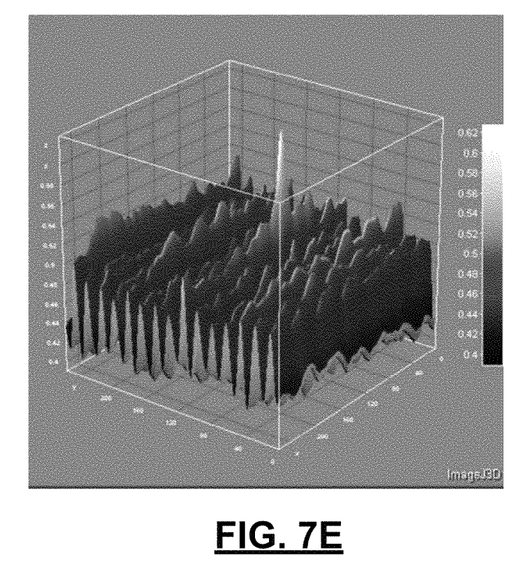

A method according to one embodiment will be described with reference to FIGS. 7A-7E. FIG. 7A illustrates an image of a device, while FIG. 7B illustrates the CAD bitmap of the device. According to this embodiment, the diffusion layer that appears dark in the image of FIG. 7A is used. In FIG. 7C, the CAD diffusion polygons are filled in and the CAD bitmap is inverted. A region substantially in the center of the CAD bitmap is selected, as shown by the square in the middle. By comparing FIG. 7C to FIG. 7A, it can be seen that the inverted CAD bitmap now resembles the actual image of the device. A cross-correlation can now be run on the image and inverted CAD bitmap to locate the maximum in the resulting image. The maximum would be the offset between the image and the CAD. This is illustrated in FIGS. 7D and 7E.

When the image is poor or when the CAD is repetitive, this procedure may fail. Conversely, when the process produces a match, it would be beneficial to provide a confidence level of the obtained result.

Figure 8A:
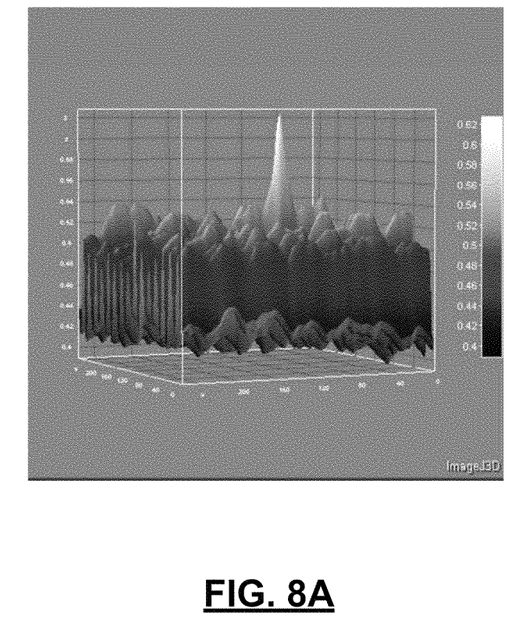
FIGS. 8A-8B relate a determination of quality of fit using peak RMS/standard deviation ratio in accordance with certain embodiments.
Figure 8B:
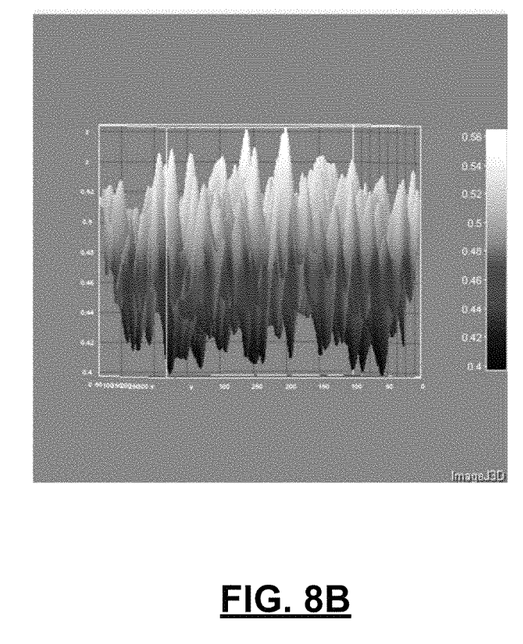

According to one embodiment, to determine the quality of the fit result, the largest peak obtained in the cross-correlation is examined. According to one embodiment, the ratio of Peak RMS/Standard deviation is compared to a threshold or a range of acceptable values. According to another embodiment, the measured peak maximum can be compared to the second large local maximum. An example of a good result is shown in FIG. 8A and an example of a bad result is shown in FIG. 8B.

According to one embodiment, when the result of the alignment is poor or fails, the CAD image is broken into several sections, and the cross-correlation is run for each of the sections in parallel. The offset found by the majority of the sections is chosen as the best offset.

Figure 9A:
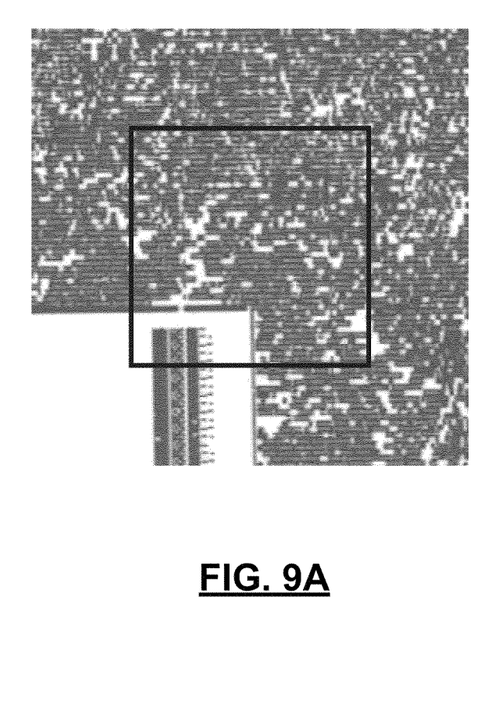
FIGS. 9A and 9B illustrate an example wherein alignment is off but the system is able to correct alignment.
Figure 9B:
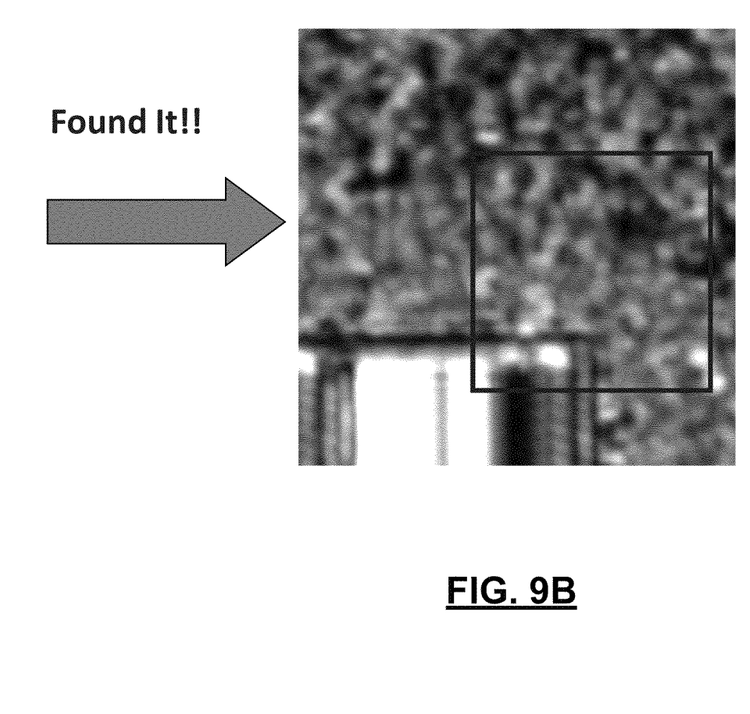
Figure 10A:
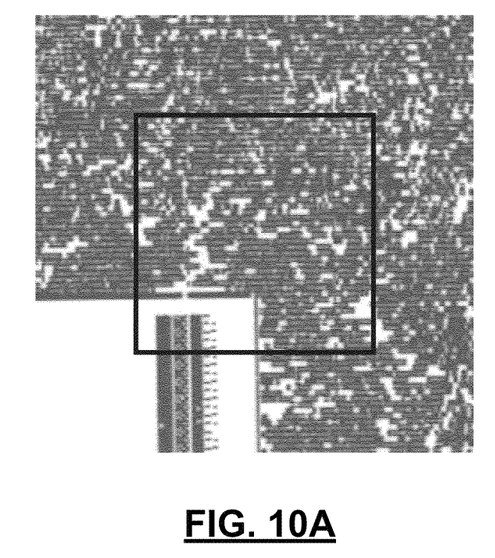
FIGS. 10A and 10B illustrate an example wherein alignment is off and the system is unable to correct alignment.
Figure 10B:
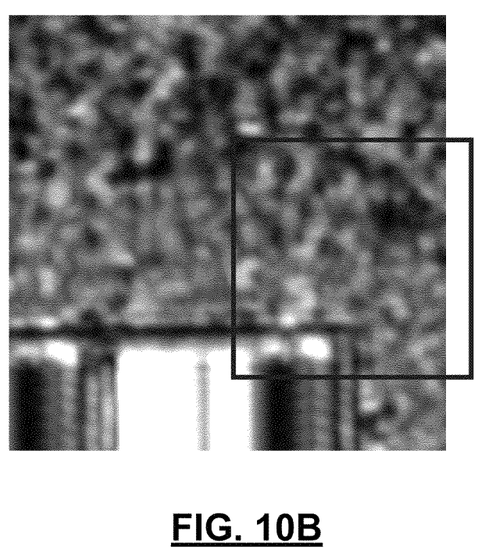

FIGS. 9A and 9B illustrate an example wherein the alignment was slightly off and the system was able to find the area of the CAD and correct the alignment. On the other hand, FIGS. 10A and 10B illustrate the case where the alignment was too much off, such that CAD sub-region could not be found within the image. The following is an embodiment that aims to deal with such situations.

Figure 11A:
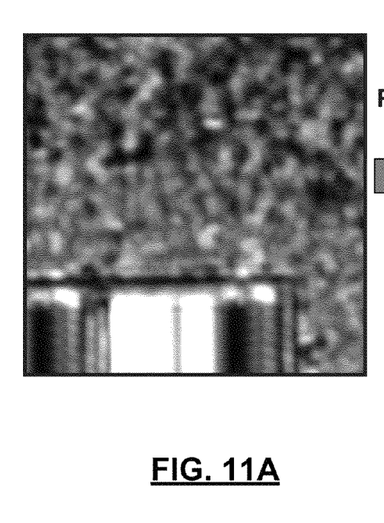
FIGS. 11A and 11B illustrate an example in which instead of searching for a sub-region of the CAD in the image, the process searches for a whole image within a larger CAD area in accordance with certain embodiments.
Figure 11B:
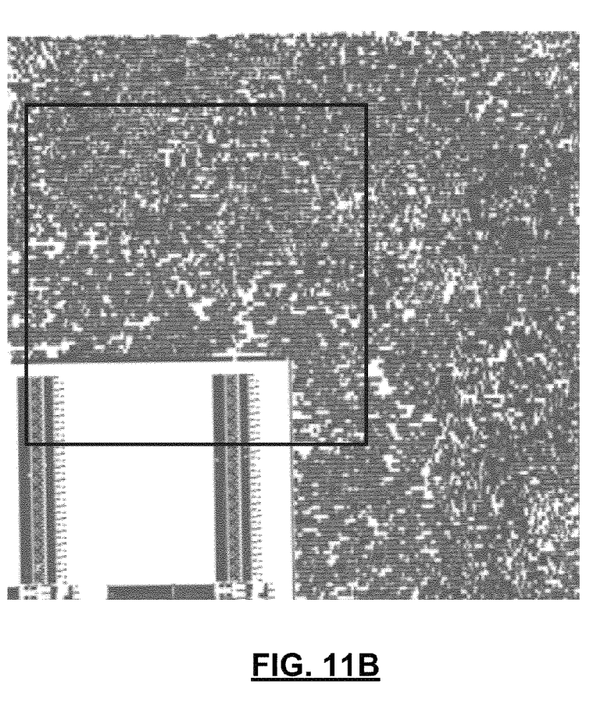

According to this embodiment, instead of searching for a sub-region of the CAD in the image, the process searches for a whole image within a larger CAD area. This is illustrated in FIGS. 11A and 11B. In certain embodiments, the process proceeds as follows. For a given image, import a CAD area that is four times larger than the image field of view. Then, use existing methods to process CAD image to produce image similar to LSM. Then calculate cross-correlation of the image within larger CAD. The result will be used in the standard manner to find best match between CAD and image.

However, the time and computer memory needed to import larger CAD area will increase linearly. Therefore, to make this solution viable both issues have to be addressed.

In accordance with one solution, instead of importing vector CAD, import series of CAD bitmaps, one for each layer, and use them to produce images for cross-correlation.

In accordance with another solution, the search for the image can be done on NEXS side, potentially opening whole CAD space for the search.

In certain embodiments, the LSM image is cropped to produce smaller ROI. This reduces errors caused by LSM distortions and stage-to pixel-calibration errors. The method may put stricter requirements on LSM image regularity.

While embodiments and applications have been shown and described, it would be apparent to those skilled in the art having the benefit of this disclosure that many more modifications than mentioned above are possible without departing from the inventive concepts disclosed herein. The invention, therefore, is not to be restricted except in the spirit of the appended claims.

What is claimed is:

1. A method for aligning an image of at least a portion of a semiconductor device with a rendering of a corresponding CAD (computer-aided design) representation thereof, comprising:
receiving diffusion layer information of the portion of the semiconductor device;
receiving implant layer information of the portion of the semiconductor device;
deriving distinct p- and n-doped region information from the received diffusion and implant layer information;
rendering the CAD representation, said rendering including a differentiation between the distinct p- and n-doped regions; and
performing an alignment operation of the portion of the image of the semiconductor device with the rendered CAD representation.

2. The method of claim 1, wherein deriving distinct p- and n-doped region information comprises overlaying the received diffusion and implant layer information, and wherein rendering the CAD representation includes assigning n and p diffusion regions in the rendering.

3. The method of claim 2, further comprising:
assigning, in the rendered CAD representation, n-diffusion to regions of overlapping diffusion and n-implantation; and
assigning, in the rendered CAD representation, p diffusion to regions of overlapping diffusion and p-implantation.

4. The method of claim 2, further comprising:
assigning, in the rendered CAD representation, n-diffusion to regions of overlapping diffusion and n-implantation; and
assigning, in the rendered CAD representation, p diffusion to regions of no overlapping of diffusion and n-implantation.

5. The method of claim 2, further comprising:
assigning, in the rendered CAD representation, p-diffusion to regions of overlapping diffusion and p-implantation; and
assigning, in the rendered CAD representation, n diffusion to regions of no overlapping of diffusion and p-implantation.

6. The method of claim 1, further comprising assigning different grayscale values to p- and n-doped regions in the rendered CAD representation.

7. An alignment system comprising:
an image capture module operable to capture of an image of a patterned semiconductor device;
a CAD (computer-aided design) tool operable to provide diffusion layer information and implant layer information; and
an alignment tool operable to:
receive the diffusion layer information, implant layer information, and image information representative of the captured image, overlay the diffusion layer information and implant layer information to derive therefrom a rendered CAD representation that includes a differentiation between the distinct p- and n-doped regions, and
align the rendered CAD representation to the image information.

8. The system of claim 7, wherein the alignment tool is further operable to:
assign, in the rendered CAD representation, n-diffusion to regions of overlapping diffusion and n-implantation; and
assign, in the rendered CAD representation, p diffusion to regions of overlapping diffusion and p-implantation.

9. The system of claim 7, wherein the alignment tool is further operable to:
assign, in the rendered CAD representation, n-diffusion to regions of overlapping diffusion and n-implantation; and
assign, in the rendered CAD representation, p diffusion to regions of no overlapping of diffusion and n-implantation.

10. The system of claim 7, wherein the alignment tool is further operable to:
assign, in the rendered CAD representation, p-diffusion to regions of overlapping diffusion and p-implantation; and
assign, in the rendered CAD representation, n diffusion to regions of no overlapping of diffusion and p-implantation.

11. The system of claim 7, wherein the alignment tool is further operable to assign different grayscale values to p- and n-doped regions in the rendered CAD representation.

12. A non-transitory computer readable storage medium storing one or more programs configured to be executed by one or more computing devices, said programs, when executing on the one or more computing devices, performing a method for aligning an image of at least a portion of a semiconductor device with a corresponding CAD (computer-aided design) representation thereof, the method comprising:
receiving diffusion layer information of at least the portion of the semiconductor device;
receiving implant layer information of said at least the portion of the semiconductor device;
deriving distinct p- and n-doped region information from the received diffusion and implant layer information;
rendering the CAD representation, including a differentiation between the distinct p- and n-doped regions; and
performing an alignment operation of the image of the semiconductor device with the rendered CAD representation.

13. The non-transitory computer readable storage medium of claim 12, wherein deriving distinct p- and n-doped region information comprises overlaying the received diffusion and implant layer information, and wherein rendering the CAD representation includes assigning n and p diffusion regions in the rendering.

14. The non-transitory computer readable storage medium of claim 13, said method further comprising:
assigning, in the rendered CAD representation, n-diffusion to regions of overlapping diffusion and n-implantation; and
assigning, in the rendered CAD representation, p diffusion to regions of overlapping diffusion and p-implantation.

15. The non-transitory computer readable storage medium of claim 13, said method further comprising:
assigning, in the rendered CAD representation, n-diffusion to regions of overlapping diffusion and n-implantation; and
assigning, in the rendered CAD representation, p diffusion to regions of no overlapping of diffusion and n-implantation.

16. The non-transitory computer readable storage medium of claim 13, said method further comprising:
assigning, in the rendered CAD representation, p-diffusion to regions of overlapping diffusion and p-implantation; and
assigning, in the rendered CAD representation, n diffusion to regions of no overlapping of diffusion and p-implantation.

17. The non-transitory computer readable storage medium of claim 12, said method further comprising assigning different grayscale values to p- and n-doped regions in the rendered CAD representation.

18. An alignment tool operable to receive an image of a patterned semiconductor device, diffusion layer information, and implant layer information, overlay the diffusion layer information and implant layer information to derive therefrom a rendered CAD representation that includes a differentiation between distinct p- and n-doped regions, and align the rendered CAD representation to the image information.

19. The alignment tool of claim 18, wherein the alignment tool is further operable to:
assign, in the rendered CAD representation, n-diffusion to regions of overlapping diffusion and n-implantation; and
assign, in the rendered CAD representation, p diffusion to regions of overlapping diffusion and p-implantation.

20. The alignment tool of claim 18, wherein the alignment tool is further operable to:
assign, in the rendered CAD representation, n-diffusion to regions of overlapping diffusion and n-implantation; and
assign, in the rendered CAD representation, p diffusion to regions of no overlapping of diffusion and n-implantation.

21. The alignment tool of claim 18, wherein the alignment tool is further operable to:
assign, in the rendered CAD representation, p-diffusion to regions of overlapping diffusion and p-implantation; and
assign, in the rendered CAD representation, n diffusion to regions of no overlapping of diffusion and p-implantation.

22. The alignment tool of claim 18, wherein the alignment tool is further operable to assign different grayscale values to p- and n-doped regions in the rendered CAD representation.

* * * * *